United States Patent [19]
Fujishima et al.

[11] Patent Number: 4,593,382
[45] Date of Patent: Jun. 3, 1986

[54] MOS DYNAMIC MEMORY DEVICE

[75] Inventors: Kazuyasu Fujishima; Kazuhiro Shimotori; Hideyuki Ozaki; Takao Nakano, all of Hyogo, Japan

[73] Assignee: Mitsubishi Denki Kabushiki Kaisha, Tokyo, Japan

[21] Appl. No.: 418,911

[22] Filed: Sep. 16, 1982

[30] Foreign Application Priority Data

Sep. 16, 1981 [JP] Japan ................... 56-147547

[51] Int. Cl.⁴ ............................................. G11C 11/24
[52] U.S. Cl. ..................................... 365/149; 365/203
[58] Field of Search ............... 365/149, 202, 203, 189

[56] References Cited

U.S. PATENT DOCUMENTS

| 3,909,631 | 9/1975 | Kitagawa | 365/203 |
| 4,061,954 | 12/1977 | Proebsting et al. | 365/203 X |
| 4,409,672 | 10/1983 | Takemae | 365/149 |

OTHER PUBLICATIONS

H. H. Chao et al., "A 34 μm Dram Cell Fabricated with a 1 μm Single Level Polycide FET Technology", Proceedings of the 1981 IEEE International Solid-State Circuits Conference, pp. 152, 153.

J. Y. Chan et al., "A 100 ns 5V Only 64K x 1 MOS Dynamic RAM", IEEE J. of Solid-State Circuits, vol. SC-15, pp. 839-846, Oct. 1980.

F. Yanagawa et al., "A 1-μum Mo-Poly 64-kbit MOS RAM", IEEE Journal of Solid-State Circuits, vol. SC-15, pp. 667-671, Aug. 1980.

Primary Examiner—Joseph A. Popek
Attorney, Agent, or Firm—Sughrue, Mion, Zinn, Macpeak and Seas

[57] ABSTRACT

An MOS dynamic memory device is improved in operation by adding a cell plate voltage control circuit to terminals of the word lines and connected to respective cell plates. In operation, the cell plate is recharged after discharged during with a time which a word line remains driven.

8 Claims, 13 Drawing Figures

MOS DYNAMIC MEMORY DEVICE

BACKGROUND OF THE INVENTION

This invention relates to an MOS dynamic random access memory (RAM) device of the single transistor type in which the cell plate voltage is controlled by a word line signal to thereby obtain a large signal at high speed.

In general, in MOS dynamic RAMs of the single transistor type, the presence and absence of a charge accumulated on a MOS capacitor are related to the binary signals 1 and 0, respectively, and the accumulated charge on the MOS capacitor is transferred to a bit line by turning on a transfer gate. A small voltage variation generated on the bit line depending on the state of the charge is detected by a sensing amplifier circuit.

FIG. 1 shows a conventional array of MOS dynamic memories. In FIG. 1, memory cells 1 are arranged, in a matrix, in left and right halves of the array, respectively. FIG. 2 is a cross sectional illustration of one of the memory cells.

In FIG. 2, the memory cell 1 includes a bit line 4 of metal, a word line 5 of electrode material such as polysilicon, a memory capacitor cell plate 8, a gate oxide layer 10, a memory terminal 11 of an N-type region and a thick field oxide layer 12 for isolating adjacent memory cell, which are to be described later.

Returning to FIG. 1, memory cells are provided in each of the halves. A dummy cell 3 is provided for each bit line 4 of each line of the memory cells in each matrix half, and a sensing amplifier 2 is connected between each bit line 4 in one of the matrix halves and a corresponding bit line in other matrix half. A word line 5 is provided for each row of memory cells 1 in each matrix half and a dummy word line 6 is provided for each row of the dummy cells 3. The dummy cells 3 in each row are connected to a $\phi_p$ line 7 through which a $\phi_p$ signal is supplied. Cell plates 8 are provided for each matrix half for applying a memory capacity voltage $V_{DD}$ to the memory cells 1 and the dummy cells 3 in the matrix half.

In operation, when, for example, one of the word lines 5 in the left side of the matrix is selected, a right side dummy word line 6 connected to the dummy cell having half of the memory capacity is selected. Thus, a signal charge of the bit lines 4 in the left half is transferred to the corresponding bit lines 4 in the right half, and a small potential difference caused thereby is detected and amplified by the sensing amplifier 2.

In the conventional operation of the memory, the amount of the signal charge transferred to the bit line 4 when the word line voltage assumes the $V_{DD}$ level is $C_s$ ($V_{DD} - V_T$) where $C_s$ is the memory capacity and $V_T$ is the threshold voltage of the transfer gate. Further, when an RC component of the word line is large, the word line signal is delayed and the read-out speed at the terminal position is lowered, causing high speed operation to be impossible.

SUMMARY OF THE INVENTION

Therefore, an object of the present invention is to provide an MOS dynamic memory by which the amount of signal charge to be handled is considerably increased and wherein the delay of the word line signal is compensated so that a large signal charge can be transferred to the bit line at high speed.

In order to achieve the above object, according to the present invention, a cell plate voltage control circuit is provided by which the cell plate voltage is discharged by the word line signal and is then re-charged within a time in which the word line is selectively driven.

DETAILED DESCRIPTION OF THE PREFERRED EMBODIMENTS

Figure 3:
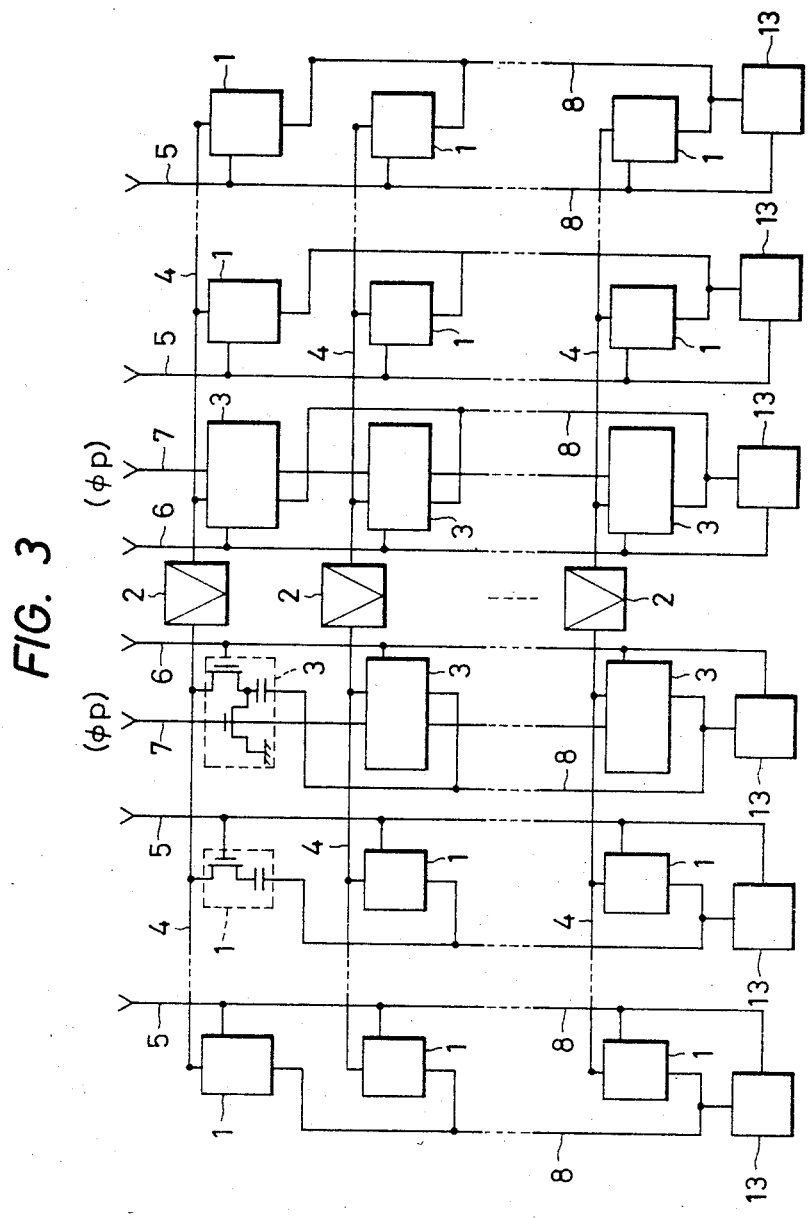
FIG. 3 is a schematic circuit diagram showing an embodiment of a MOS dynamic memory device according to the present invention.

FIG. 3 shows an embodiment of the MOS dynamic memory according to the present invention. The cell plate voltage control circuit is depicted by reference numeral 13, three examples 13a–13c of which are shown in detail in FIGS. 4 to 6, respectively.

Figure 1:
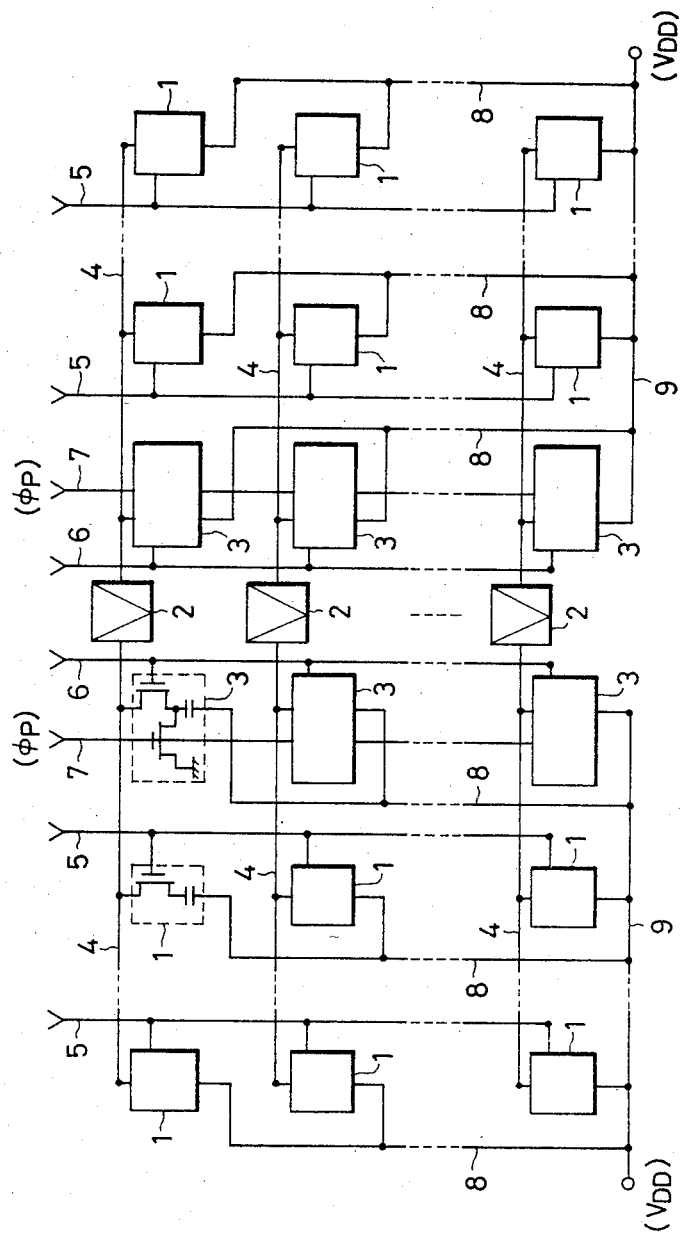
FIG. 1 is a schematic circuit diagram showing the memory array of a conventional MOS dynamic memory device.
Figure 2:
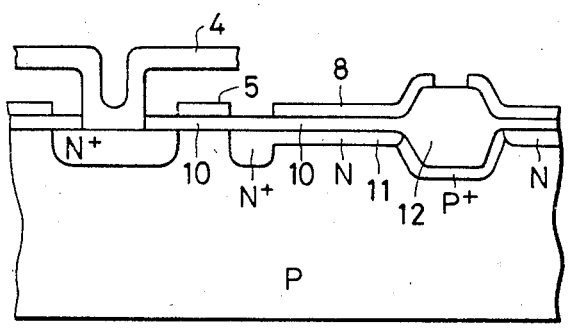
FIG. 2 is a cross-sectional view of one of the memory cells of FIG. 1.
Figure 4:
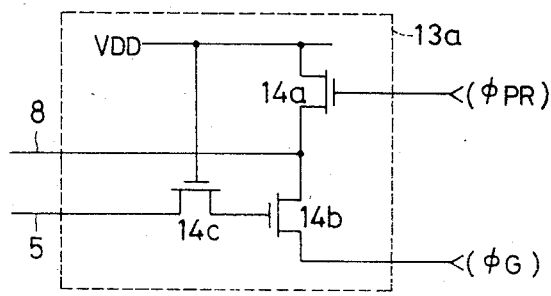
FIG. 4 is a circuit diagram of one embodiment of a cell plate voltage control circuit of FIG. 3.
Figure 5:
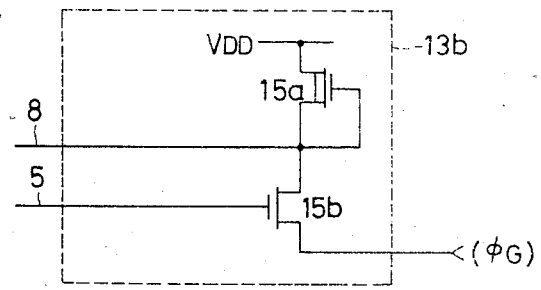
FIG. 5 is a circuit diagram showing another embodiment of the cell plate voltage control circuit of FIG. 3.
Figure 6:
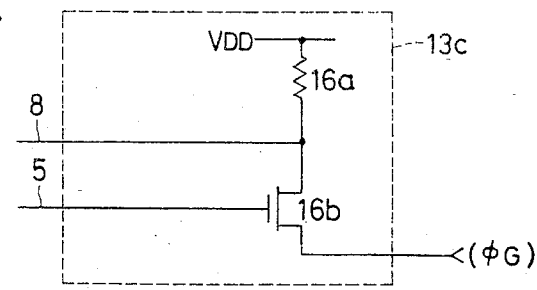
FIG. 6 shows a further embodiment of the cell plate voltage control circuit of FIG. 3.
Figure 7:
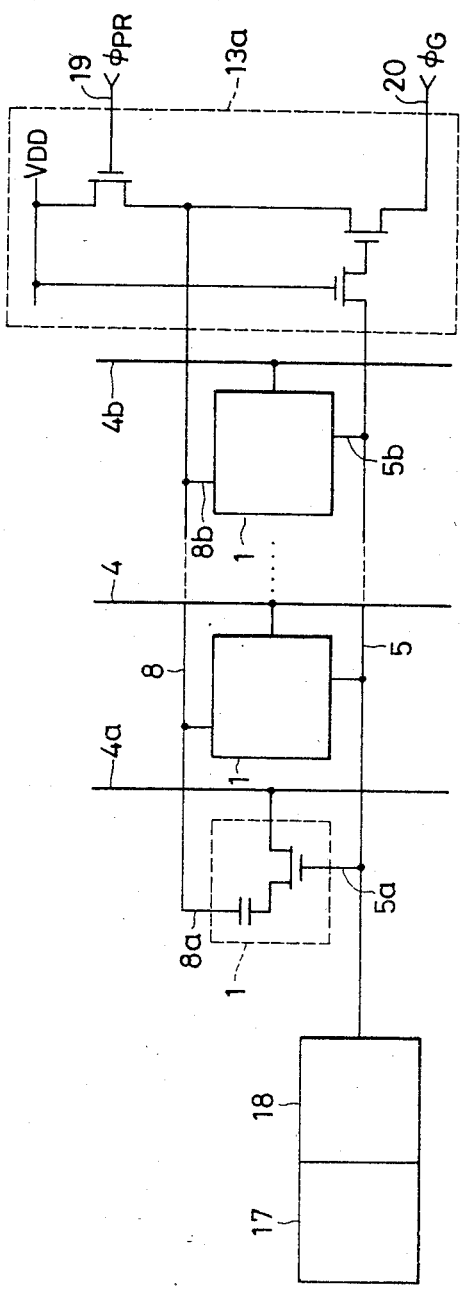
FIG. 7 is a circuit diagram for one of word lines of FIG. 3.
Figure 8:
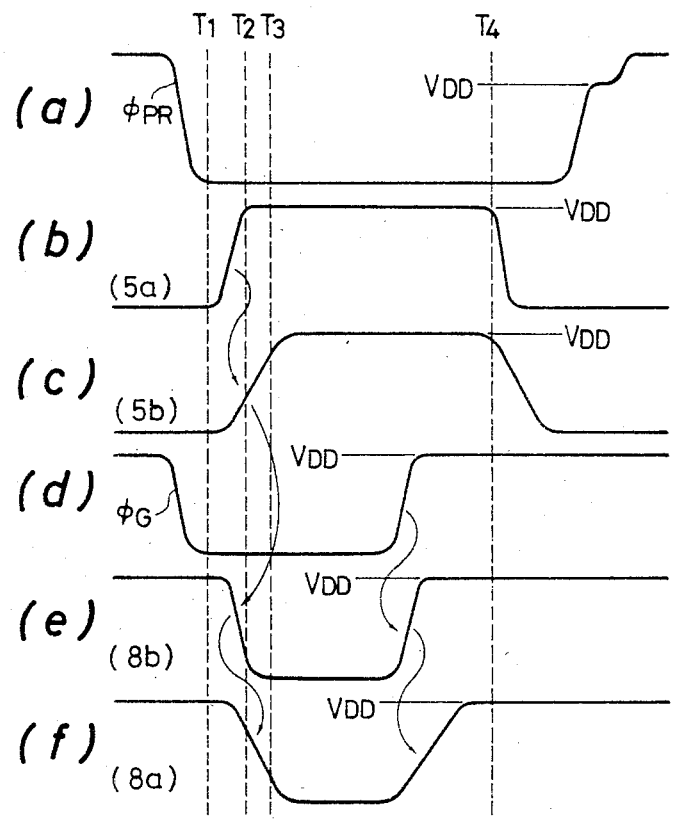
FIGS. 8a to 8f show waveforms at various portions of the circuit in FIG. 7, respectively.

The cell plate voltage control circuit shown in FIG. 4 includes enhancement type transistors 14a to 14c; that in FIG. 5 includes a depletion type transistor 15a and an enhancement type transistor 15b; and that in FIG. 6 includes a resistor 16a and an enhancement type transistor 16b. FIG. 7 is a circuit diagram for one of the word lines of FIG. 3 with the cell plate voltage control circuit of FIG. 4 incorporated therein. In FIG. 7, an X decoder 17, a word line driver 18, a $\phi_{PR}$ line 19 through which a $\phi_{PR}$ signal shown in FIG. 8a is sent, and a $\phi_G$ line 20 through which a $\phi_G$ signal shown in FIG. 8d is sent, are illustrated. A driving terminal 5a of the word line 5 receives a waveform as shown in FIG. 8b, while a terminal 5b of the word line 5 receives a waveform as shown in FIG. 8c. A discharge terminal 8b of the cell plate 8 exhibits a waveform as shown in FIG. 8e and a terminal 8a of the cell plate 8 exhibits a waveform as shown in FIG. 8f.

The operation of the MOS dynamic memory thus constructed will be described with reference to FIG. 7. When the word line 5 selected by the X decoder 17 is driven by the word line driver 18, the signal at the terminal 5b of the word line 5 rises slowly when compared with the signal at the driving terminal 5a of the line 5, as shown in FIGS. 8b and 8c, respectively. Therefore, the cell plate 8, which has been charged to the source voltage $V_{DD}$, is discharged upon the leading edge of the word line signal at the terminal 5b of the line 5, the discharge waveform being delayed with respect to the waveform in FIG. 8e, as shown in FIG. 8f. The word line signal shown in FIG. 8b which corresponds to the cell plate whose discharge is delayed as shown in FIG. 8f rises rapidly and therefore signal charge transfer from the memory cell 1 to the bit line 4 is performed at high speed and the delay of the word line signal is thus compensated for. Further, it should be noted that there is no loss of signal charge read out at this time, caused by threshold voltage $V_T$ of the transfer gate, even if the level of the word line 5 is $V_{DD}$. On the other hand, charging of the cell plate 8 is performed, after the detection and amplification of the data in the sensing amplifier circuit 2 or after the read-out operation thereof, by making the $\phi_G$ signal high before the word line 5 is closed. When the data is "1", the voltage at the memory terminal 11 which was ($V_{DD}-V_T$) with $\phi_G$ at the low level is boosted to ($V_{DD}-V_T+\alpha V_{DD}$) because the transfer gate is cut-off when the data is 1, where $\alpha$ is the boost efficiency. When the data is 0, the voltage at the memory terminal 11 which was 0 V with the signal $\phi_G$ at the low level is kept at 0 V since the transfer gate is opened with the data 0 and the bit line is clamped at 0 V by the sensing amplifier. Consequently, about $C_s$ ($V_{DD}-V_T+\alpha V_{DD}$) is accumulated as the signal charge, where $\alpha$ is usually less than 0.9. As will be clear from the circuit in FIG. 7, the charging and discharging of the cell plate voltage occurs only for the selected word line 5. The cell plate 8 of the non-selected memory cells 1 is held, by the precharging signal $\phi_{PR}$, at the source voltage $V_{DD}$ during the precharging time period.

Where the circuit shown in FIG. 5 is used as the cell plate voltage control circuit, the cell plate 8 is discharged through the transistor 15b when the word line 5 assumes the high level as in the circuit in FIG. 4 and is recharged by making the $\phi_G$ level high during when the word line is selectively driven. Also in this case the discharge of the cell plate voltage occurs only for the selected word line 5. The cell plate 8 corresponding to the non-selected word lines 5 is kept at the source voltage $V_{DD}$ through the transistor 15a.

The circuit shown in FIG. 6 uses a resistor element 16a instead of the depletion type transistor 15a as the load element of the invention. For the circuit constructions shown in FIGS. 5 and 6, there is no need of a $\phi_{PR}$ signal at or higher than $V_{DD}$ which is otherwise needed to hold the non-selected cell plate 8 in FIG. 4 at the source voltage.

As described in detail hereinbefore, according to the MOS dynamic memory of the present invention, it is possible to considerably increase the charge amount of the signal in the single transistor type memory device without changing the construction of the memory cell and without using a voltage higher than $V_{DD}$ for the word line signal, and to compensate for the word line delay due to the RC component of the line, resulting in a large signal voltage and high speed transfer.

What is claimed is:

1. In an MOS dynamic memory device of the single transistor type including a matrix of memory cells (1) arranged in rows and columns, each cell comprising a transistor and a memory capacitor, a plurality of word lines (5) arranged in one of a row or column direction of the matrix, and a plurality of bit lines (4) arranged orthogonal to the word lines, the improvement comprising: a cell plate voltage control circuit (13), said voltage control circuit comprising at least one transistor connected between cell plates (8) of the memory cells in each column of memory cells and a control signal terminal connected to said cell plate voltage control circuit and being adapted to discharge voltages applied upon a cell plate to said control signal terminal for re-charging the cell plate within a time period during which the word lines are selectively driven.

2. An MOS dynamic memory device as claimed in claim 1, wherein said cell plate voltage control circuit is arranged at a terminal portion of each of the word lines.

3. An MOS dynamic memory device as claimed in claim 1, wherein said cell plate voltage control circuit comprises three enhancement type transistors.

4. An MOS dynamic memory device as claimed in claim 1, wherein said cell plate voltage control circuit comprises a depletion type transistor and an enhancement type transistor.

5. An MOS dynamic memory device as claimed in claim 1, wherein said cell plate voltage control circuit comprises a resistor element and an enhancement type transistor.

6. An MOS dynamic memory device, comprising: a matrix of memory cells (1) arranged in rows and columns, a plurality of word lines (5) arranged in a column direction of the matrix and individually coupled to each of the memory cells in an associated column, means (17, 18) for driving said word lines, a plurality of bit lines (4) arranged orthogonal to said word lines and individually coupled to each of the memory cells in an associated row, a plurality of memory capacitor cell plates (8) individually associated with the memory cells and connected in columns parallel to said word lines, and means (13) for recharging a selected cell plate after a discharge thereof within a time period during which a word line associated with said selected cell plate remains driven.

7. An MOS dynamic memory device as claimed in claim 6, wherein said recharging means comprises a cell plate voltage control circuit containing at least one transistor, one said circuit being arranged at a terminus of each said word line.

8. An MOS dynamic memory device as claimed in claim 7, including means for triggering said at least one transistor, for applying a voltage to a cell plate connected with said voltage control circuit.

* * * * *